US010965895B2

(12) United States Patent
Watanabe

(10) Patent No.: US 10,965,895 B2
(45) Date of Patent: Mar. 30, 2021

(54) SOLID-STATE IMAGING DEVICE, MANUFACTURING METHOD OF SOLID-STATE IMAGING DEVICE, AND ELECTRONIC DEVICE

(71) Applicant: SONY CORPORATION, Tokyo (JP)

(72) Inventor: Tsuyoshi Watanabe, Kanagawa (JP)

(73) Assignee: SONY CORPORATION, Tokyo (JP)

(*) Notice: Subject to any disclaimer, the term of this patent is extended or adjusted under 35 U.S.C. 154(b) by 11 days.

(21) Appl. No.: 15/781,231

(22) PCT Filed: Dec. 2, 2016

(86) PCT No.: PCT/JP2016/085857
§ 371 (c)(1),
(2) Date: Jun. 4, 2018

(87) PCT Pub. No.: WO2017/104439
PCT Pub. Date: Jun. 22, 2017

(65) Prior Publication Data
US 2018/0359437 A1 Dec. 13, 2018

(30) Foreign Application Priority Data
Dec. 16, 2015 (JP) .............................. JP2015-245287

(51) Int. Cl.
H04N 5/369 (2011.01)
H01L 27/14 (2006.01)
(Continued)

(52) U.S. Cl.
CPC ............ H04N 5/369 (2013.01); H01L 23/08 (2013.01); H01L 24/43 (2013.01); H01L 24/97 (2013.01);
(Continued)

(58) Field of Classification Search
CPC ......... H04N 5/369; H01L 24/97; H01L 27/14; H01L 27/14623; H01L 27/14618;
(Continued)

(56) References Cited

U.S. PATENT DOCUMENTS

2006/0051887 A1    3/2006  Yamamoto et al.
2008/0185603 A1*   8/2008  Itoi ...................... H04N 5/2254
                                                              257/98
2009/0121304 A1*   5/2009  Terada .............. H01L 27/14618
                                                             257/434

FOREIGN PATENT DOCUMENTS

JP    01-194466 A    8/1989
JP    07-273301 A   10/1995
(Continued)

OTHER PUBLICATIONS

International Search Report and Written Opinion of PCT Application No. PCT/JP2016/085857, dated Jan. 10, 2017, 09 pages of ISRWO.

Primary Examiner — Lin Ye
Assistant Examiner — Chan T Nguyen
(74) Attorney, Agent, or Firm — Chip Law Group

(57) ABSTRACT

The present disclosure relates to a solid-state imaging device, a manufacturing method of a solid-state imaging device, and an electronic device capable of preventing occurrence of a flare or a ghost caused by reflection of light in a region other than a light receiving portion of a solid-state imaging element at low cost. The solid-state imaging device includes the solid-state imaging element and a sealing glass which is arranged on the solid-state imaging element and in which a light-shielding resin is embedded in a region corresponding to the region other than the light receiving portion of the solid-state imaging element. The present disclosure is applied to, for example, a solid-state imaging device in which a substrate on which the solid-state (Continued)

imaging element is die-bonded and wire-bonded is packaged, or the like.

3 Claims, 9 Drawing Sheets

(51) Int. Cl.
*H01L 23/00* (2006.01)
*H01L 27/146* (2006.01)
*H01L 23/08* (2006.01)

(52) U.S. Cl.
CPC ........ *H01L 27/14* (2013.01); *H01L 27/14618* (2013.01); *H01L 27/14621* (2013.01); *H01L 27/14623* (2013.01); *H01L 24/32* (2013.01); *H01L 24/48* (2013.01); *H01L 24/73* (2013.01); *H01L 24/92* (2013.01); *H01L 2224/48091* (2013.01); *H01L 2224/73265* (2013.01); *H01L 2224/92247* (2013.01); *H01L 2224/97* (2013.01); *H01L 2924/00014* (2013.01)

(58) Field of Classification Search
CPC ............... H01L 24/43; H01L 23/08; H01L 2924/00014; H01L 2224/73265; H01L 24/73; H01L 2224/97; H01L 2224/92247; H01L 24/48; H01L 24/32; H01L 24/92; H01L 2224/48091
USPC .......................................................... 348/294
See application file for complete search history.

(56) References Cited

FOREIGN PATENT DOCUMENTS

| | | | |
|---|---|---|---|
| JP | 11-341365 A | 12/1999 | |
| JP | 2002-261260 A | 9/2002 | |
| JP | 2006-013174 A | 1/2006 | |
| JP | 2006013174 * | 1/2006 | ............. H01L 23/02 |
| JP | 2006-100763 A | 4/2006 | |
| JP | 2012-169528 A | 9/2012 | |
| JP | 2015-012474 A | 1/2015 | |
| JP | 2015012474 * | 1/2015 | ............. H04N 5/369 |

* cited by examiner

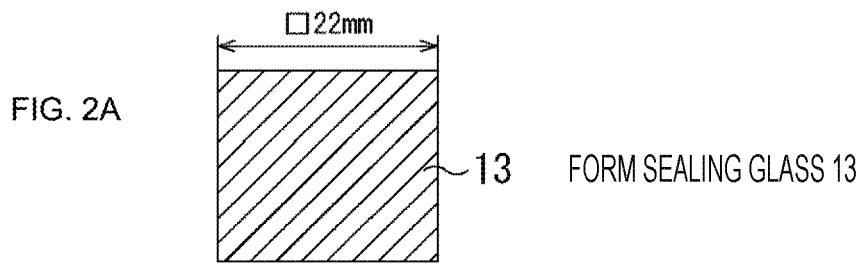
FIG. 2A — FORM SEALING GLASS 13
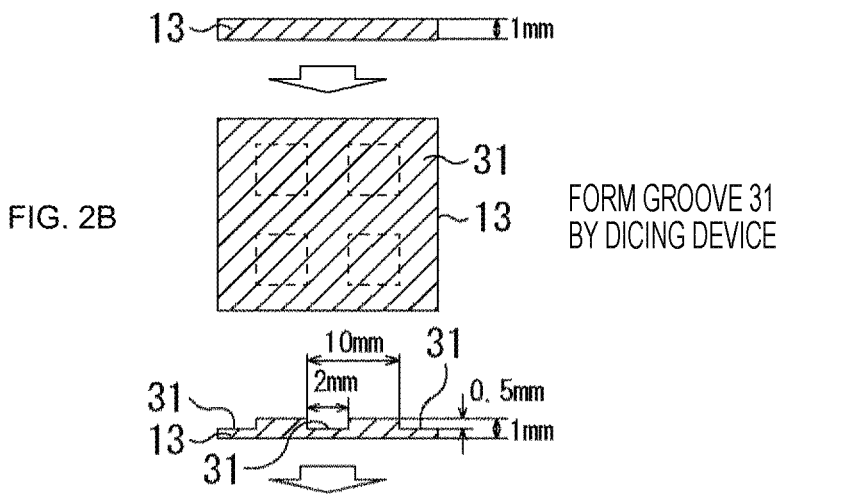
FIG. 2B — FORM GROOVE 31 BY DICING DEVICE
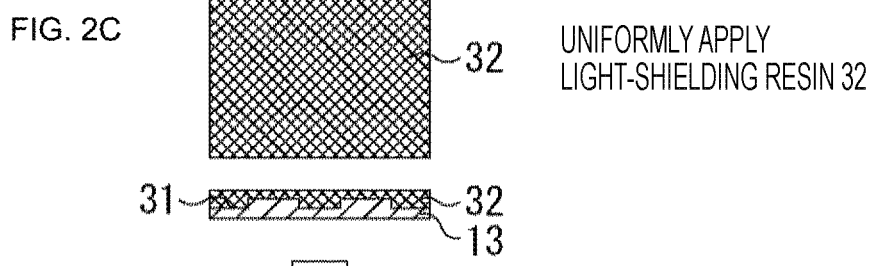
FIG. 2C — UNIFORMLY APPLY LIGHT-SHIELDING RESIN 32
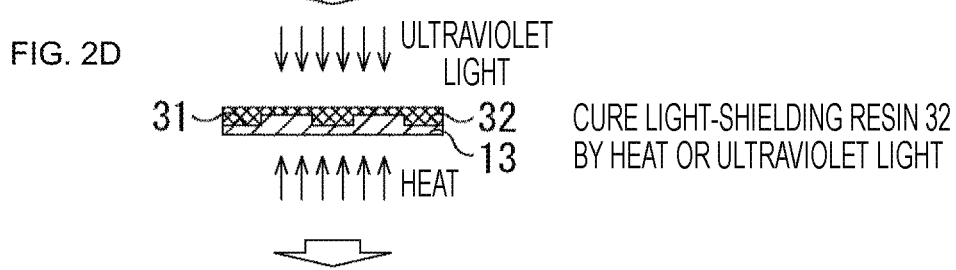
FIG. 2D — CURE LIGHT-SHIELDING RESIN 32 BY HEAT OR ULTRAVIOLET LIGHT
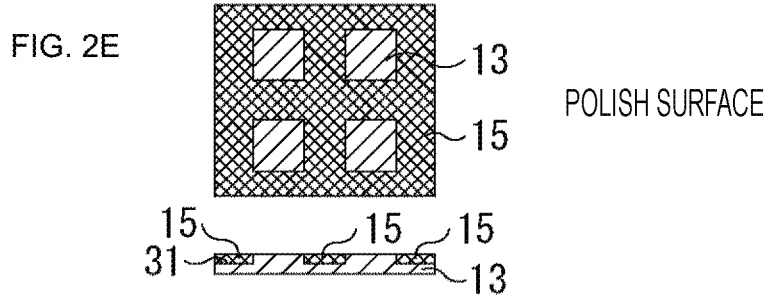
FIG. 2E — POLISH SURFACE

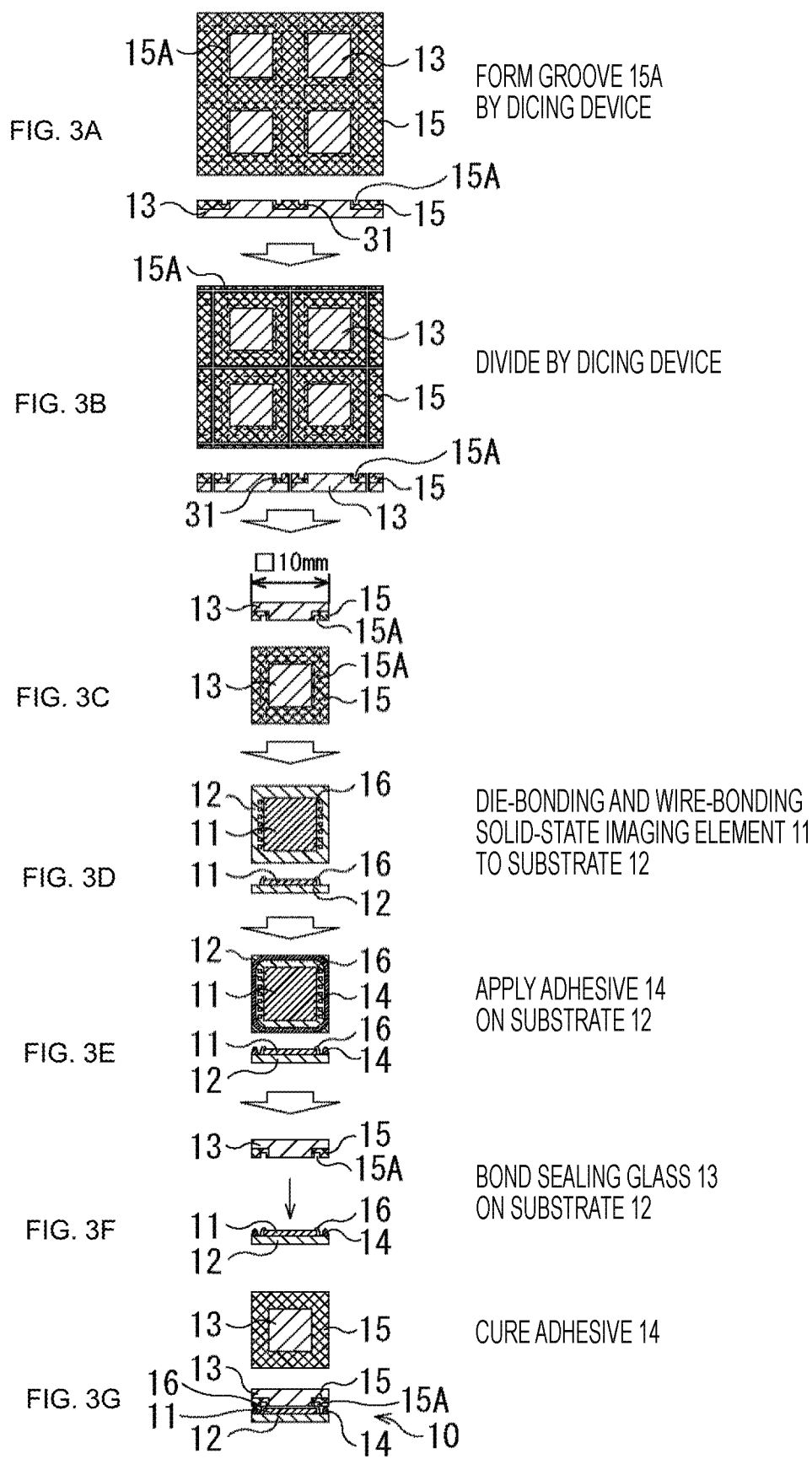

DIE-BONDING AND WIRE-BONDING SOLID-STATE IMAGING ELEMENT 11 TO SUBSTRATE 12

APPLY ADHESIVE 14 ON SUBSTRATE 12

BOND SEALING GLASS 13 ON SUBSTRATE 12

DIVIDE AFTER ADHESIVE 14 IS CURED

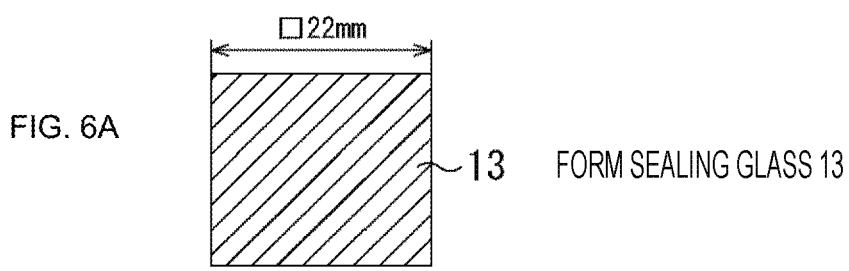
FIG. 6A — FORM SEALING GLASS 13
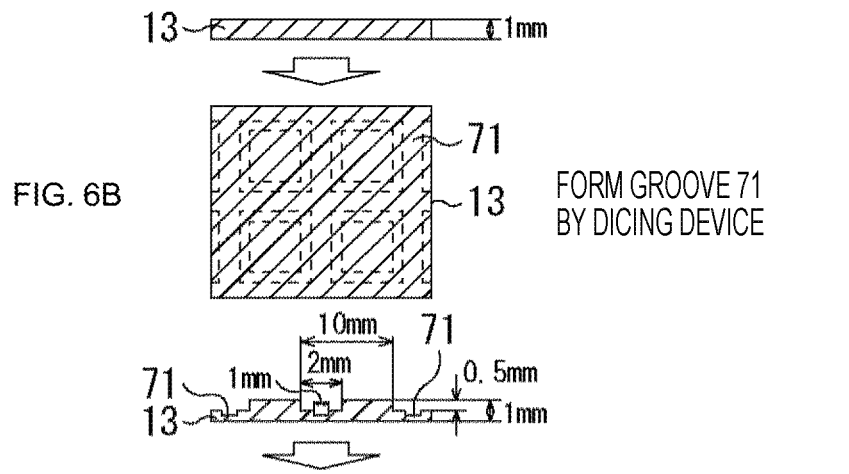
FIG. 6B — FORM GROOVE 71 BY DICING DEVICE
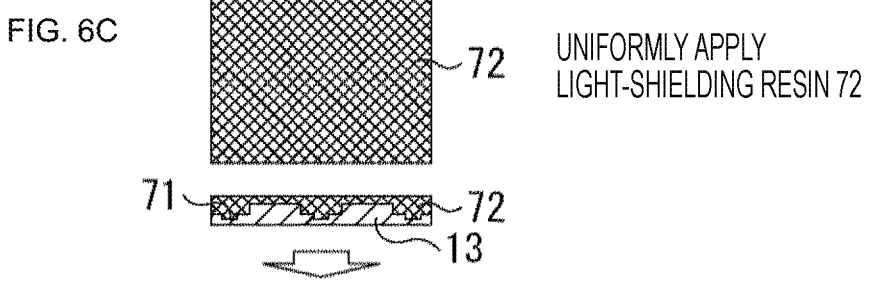
FIG. 6C — UNIFORMLY APPLY LIGHT-SHIELDING RESIN 72
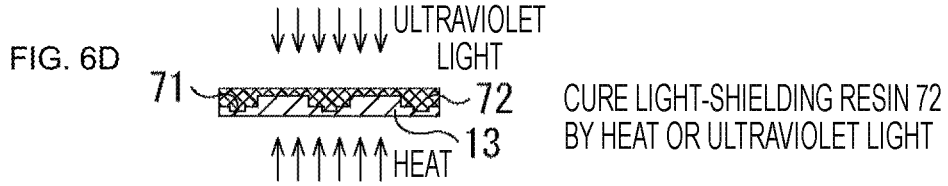
FIG. 6D — CURE LIGHT-SHIELDING RESIN 72 BY HEAT OR ULTRAVIOLET LIGHT
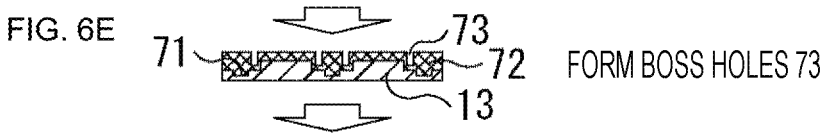
FIG. 6E — FORM BOSS HOLES 73
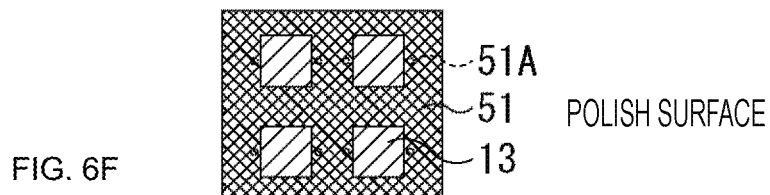
FIG. 6F — POLISH SURFACE
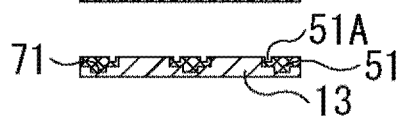

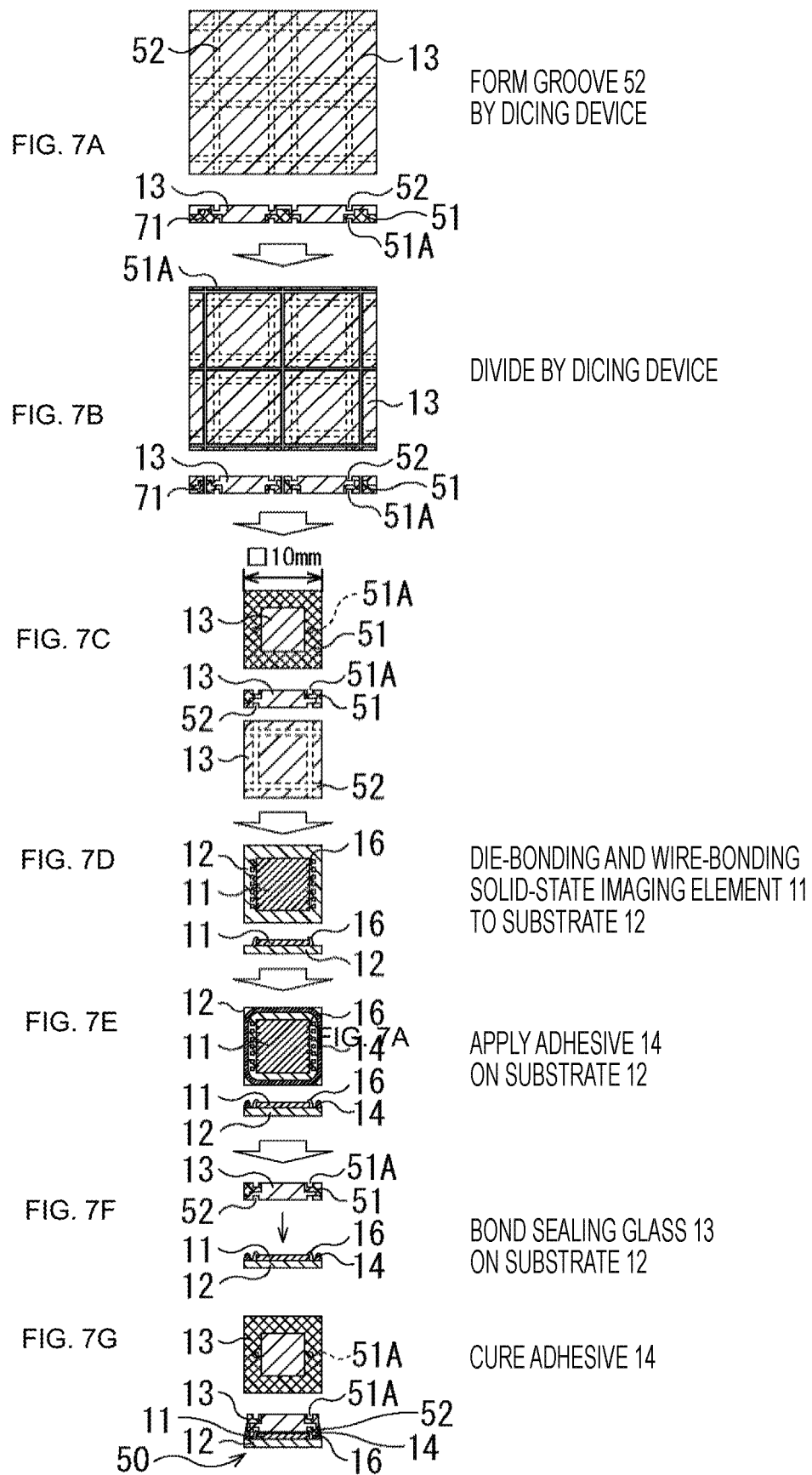

SOLID-STATE IMAGING DEVICE, MANUFACTURING METHOD OF SOLID-STATE IMAGING DEVICE, AND ELECTRONIC DEVICE

CROSS REFERENCE TO RELATED APPLICATIONS

This application is a U.S. National Phase of International Patent Application No. PCT/JP2016/085857 filed on Dec. 2, 2016, which claims priority benefit of Japanese Patent Application No. JP 2015-245287 filed in the Japan Patent Office on Dec. 16, 2015. Each of the above-referenced applications is hereby incorporated herein by reference in its entirety.

TECHNICAL FIELD

The present disclosure relates to a solid-state imaging device, a manufacturing method of a solid-state imaging device, and an electronic device, and more particularly, to a solid-state imaging device, a manufacturing method of a solid-state imaging device, and an electronic device capable of preventing occurrence of a flare or a ghost caused by reflection of light in a region other than a light receiving portion of a solid-state imaging element at low cost.

BACKGROUND ART

A flare or a ghost occurs in an image screen due to reflection of light in a region other than a light receiving portion in a package of a solid-state imaging device. Therefore, it has been proposed to prevent the occurrence of the flare by covering the region other than the light receiving portion with a flare preventing plate (for example, refer to Patent Document 1).

CITATION LIST

Patent Document

Patent Document 1: Japanese Patent Application Laid-Open No. 7-273301

SUMMARY OF THE INVENTION

Problems to be Solved by the Invention

However, in a case where a plate member such as a flare preventing plate and a molded member is arranged in the region other than the light receiving portion, processing using a mold is required, and cost increases.

The present disclosure has been made in view of such a situation, and an object of the present disclosure is to prevent occurrence of a flare or a ghost caused by reflection of light in a region other than a light receiving portion of a solid-state imaging element at low cost.

Solutions to Problems

A solid-state imaging device according to a first aspect of the present disclosure is a solid-state imaging device including a solid-state imaging element, and a glass plate arranged on the solid-state imaging element and in which a light-shielding resin is embedded in a region corresponding to a region other than a light receiving portion of the solid-state imaging element.

An electronic device according to the first aspect of the present disclosure corresponds to the solid-state imaging device according to the first aspect of the present disclosure.

The first aspect of the present disclosure includes the solid-state imaging element and the glass plate arranged on the solid-state imaging element and in which the light-shielding resin is embedded in the region corresponding to a region other than the light receiving portion of the solid-state imaging element.

A manufacturing method according to a second aspect of the present disclosure is a manufacturing method of a solid-state imaging device in which a groove is formed in a region of a glass plate corresponding to a region other than a light receiving portion of a solid-state imaging element, a light-shielding resin is embedded into the groove and cured, and the glass plate is arranged on the solid-state imaging element.

In the second aspect of the present disclosure, a groove is formed in a region of a glass plate corresponding to a region other than a light receiving portion of a solid-state imaging element, a light-shielding resin is embedded into the groove and cured, and the glass plate is arranged on the solid-state imaging element.

Effects of the Invention

According to the first aspect of the present disclosure, the occurrence of the flare or the ghost caused by reflection of light in the region other than the light receiving portion of the solid-state imaging element can be prevented at low cost.

In addition, according to the second aspect of the present disclosure, a solid-state imaging device which prevents the occurrence of the flare or the ghost caused by reflection of light in the region other than the light receiving portion of the solid-state imaging element can be manufactured at low cost.

Note that the effects described herein are not limited and that the effect may be any effects described in the present disclosure.

BRIEF DESCRIPTION OF DRAWINGS

FIGS. 2A, 2B, 2C, 2D, and 2E are diagrams to describe a first example of a manufacturing method of the solid-state imaging device in FIGS. 1A and 1B.

FIGS. 3A, 3B, 3C, 3D, 3E, 3F, and 3G are diagrams to describe the first example of the manufacturing method of the solid-state imaging device in FIGS. 1A and 1B.

FIGS. 6A, 6B, 6C, 6D, 6E, and 6F are diagrams to describe an example of a manufacturing method of the solid-state imaging device in FIGS. 5A and 5B.

FIGS. 7A, 7B, 7C, 7D, 7E, 7F, and 7G are diagrams to describe the example of the manufacturing method of the solid-state imaging device in FIGS. 5A and 5B.

MODE FOR CARRYING OUT THE INVENTION

Embodiments for carrying out the present disclosure (referred to as embodiment below) will be described below. Note that, the description will be in the following order.

1. First Embodiment: Solid-State Imaging Device (FIGS. 1A, 1B, 2A, 2B, 2C, 2D, 2E, 3A, 3B, 3C, 3D, 3E, 3F, 3G, 4A, 4B, 4C, and 4D)
2. Second Embodiment: Solid-State Imaging Device (FIGS. 5A, 5B, 6A, 6B, 6C, 6D, 6E, 6F, 7A, 7B, 7C, 7D, 7E, 7F, and 7G)
3. Third Embodiment: Imaging Device (FIG. 8)
4. Exemplary Usage of Solid-State Imaging Device (FIG. 9)

First Embodiment (Exemplary Configuration of First Embodiment of Solid-State Imaging Device)

Figure 1A:
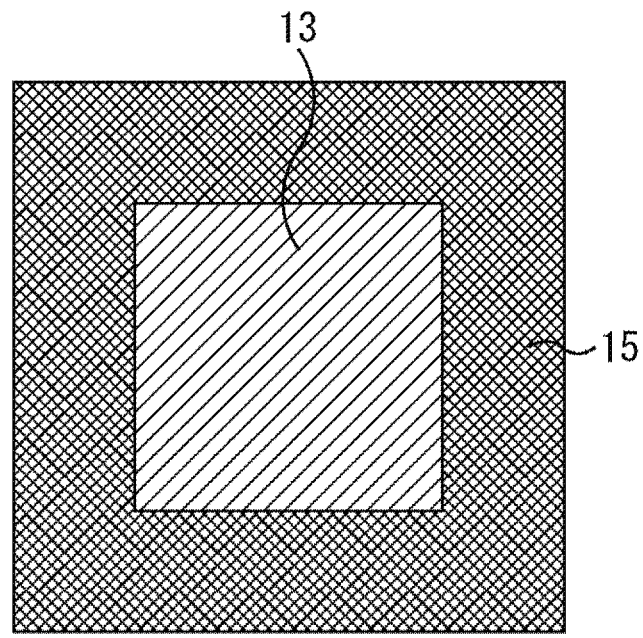
FIGS. 1A and 1B are diagrams of an exemplary configuration of a first embodiment of a solid-state imaging device to which the present disclosure is applied.
Figure 1B:
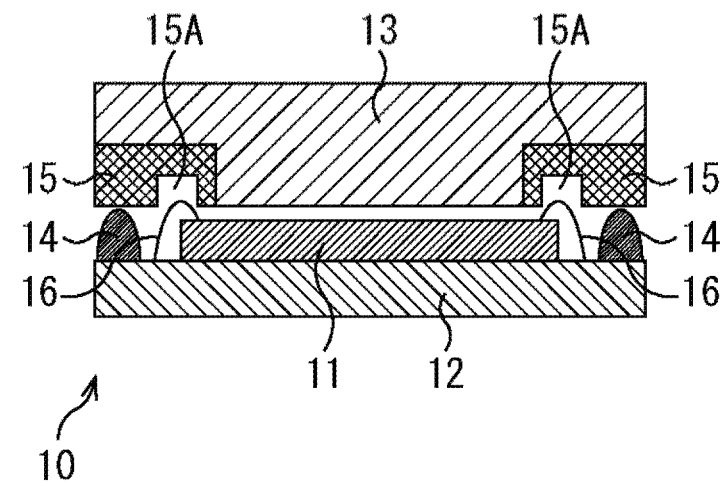

FIGS. 1A and 1B are diagrams of an exemplary configuration of a first embodiment of a solid-state imaging device to which the present disclosure is applied.

A solid-state imaging device 10 in FIGS. 1A and 1B is packaged by bonding a substrate 12, on which a solid-state imaging element 11 is die-bonded and wire-bonded, to a sealing glass 13 (glass plate) via a black adhesive 14 applied on an outer periphery of the substrate 12. FIG. 1A is a diagram of the sealing glass 13 viewed from the side of the substrate 12, and FIG. 1B is a cross-sectional diagram of the solid-state imaging device 10.

As illustrated in FIGS. 1A and 1B, on a surface of the sealing glass 13 facing to the solid-state imaging element 11, a black light-shielding resin 15 is embedded in a region corresponding to an outer periphery (step portion between solid-state imaging element 11 and substrate 12) which is a region other than a light receiving portion (not shown) of the solid-state imaging element 11. With this structure, the outer periphery of the solid-state imaging element 11 is shielded from light. As a result, occurrence of a flare or a ghost caused by reflection of light in the outer periphery can be prevented.

Furthermore, in the light-shielding resin 15, a groove 15A is formed in a region corresponding to an arch-like portion of a wire bond 16, formed by wire-bonding, for connecting the solid-state imaging element 11 to the substrate. With this groove 15A, the arch-like portion of the wire bond 16 can enter the groove 15A. As a result, it is not necessary to provide a molded member to prevent a contact between the wire bond 16 and the sealing glass 13 in the solid-state imaging device 10, and manufacturing cost can be reduced. In addition, it is possible to reduce the height of the solid-state imaging device 10.

Furthermore, the substrate 12 may be a ceramic substrate or an organic substrate.

(First Example of Manufacturing Method of Solid-State Imaging Device)

FIGS. 2A, 2B, 2C, 2D, 2E, 3A, 3B, 3C, 3D, 3E, 3F, and 3G are diagrams to describe a first example of a manufacturing method of the solid-state imaging device 10 in FIGS. 1A and 1B.

In the example in FIGS. 2A, 2B, 2C, 2D, 2E, 3A, 3B, 3C, 3D, 3E, 3F, and 3G, a package size of the solid-state imaging device 10 is 10 mm square, and 2×2 solid-state imaging devices 10 are formed. This is similarly applied to FIGS. 4A, 4B, 4C, and 4D to be described later.

First, as illustrated in FIG. 2A, the sealing glass 13 having a size of 22 mm square and a thickness of one mm is formed by using optical glass. Note that it is desirable that the thickness of the sealing glass 13 be equal to or thicker than 0.5 mm so as not to cause warpage. Furthermore, an upper diagram in FIG. 2A is a diagram of the sealing glass 13 viewed from a side to be bonded to the substrate 12, and a lower diagram in FIG. 2A is a cross-sectional diagram of the sealing glass 13. This is similarly applied to FIG. 2B, FIG. 2C, FIG. 2E, FIG. 3A, and FIG. 3B, which will be described later.

After the sealing glass 13 has been formed, as illustrated in FIG. 2B, a dicing device forms a groove 31 having a depth of 0.5 mm at a 10-mm interval and in a region having a width of two mm as a region corresponding to the outer periphery of the solid-state imaging element 11 on the sealing glass 13.

Then, as illustrated in FIG. 2C, a light-shielding resin 32 is uniformly applied on the entire surface of the sealing glass 13 where the groove 31 has been formed so as to be completely fitted into the groove 31. It is desirable that a resin viscosity of the light-shielding resin 32 at the time of application be maintained to be equal to or less than 30 Pa·s so that bubbles do not enter the resin.

After the light-shielding resin 32 has been applied, as illustrated in FIG. 2D, the light-shielding resin 32 is cured by heat or ultraviolet light. By using a light-shielding resin having a linear expansion coefficient of equal to or less than 30 ppm/° C. and a molding shrinkage rate of equal to or less than 0.5% as the light-shielding resin 32, warpage of the cured sealing glass 13 can be reduced as possible.

After the light-shielding resin 32 has been cured, as illustrated in FIG. 2E, a plane polishing device for processing glass polishes the surface of the light-shielding resin 32 until the sealing glass 13 is exposed to be the outermost surface, and the light-shielding resin 15 is formed.

Next, as illustrated in FIG. 3A, the dicing device forms the groove 15A in the region of the light-shielding resin 15 corresponding to the arch-like portion of the wire bond 16 without exposing the sealing glass 13.

Then, as illustrated in FIG. 3B, the dicing device cuts the centers of the light-shielding resin 15 (groove 31) along the horizontal direction and the vertical direction. With this processing, as illustrated in FIG. 3C, the sealing glass 13 in which the light-shielding resin 15 is embedded is divided into pieces of 10 mm squares.

Furthermore, an upper diagram in FIG. 3C is a cross-sectional diagram of the sealing glass 13 in which the light-shielding resin 15 is embedded, and a lower diagram in FIG. 3C is a diagram of the sealing glass 13, in which the light-shielding resin 15 is embedded, viewed from the side to be bonded to the substrate 12.

After the sealing glass 13 has been divided, processing is performed for each solid-state imaging device 10. Specifically, as illustrated in FIG. 3D, the solid-state imaging element 11 is die-bonded to the substrate 12 with high accuracy, and then, is wire-bonded.

Note that an upper diagram in FIG. 3D is a diagram of the substrate 12, on which the solid-state imaging element 11 is die-bonded and wire-bonded, viewed from a side to be bonded to the sealing glass 13, and a lower diagram in FIG. 3D is a cross-sectional diagram of the substrate 12 on which the solid-state imaging element 11 is die-bonded and wire-bonded. This is similarly applied to FIG. 3E.

After the solid-state imaging element 11 has been die-bonded and wire-bonded to the substrate 12, as illustrated in FIG. 3E, the black adhesive 14 is uniformly applied on the outer periphery of the substrate 12. Then, as illustrated in FIG. 3F, the surface of the substrate 12 where the solid-state imaging element 11 is arranged faces to the surface of the sealing glass 13 where the light-shielding resin 15 is embedded, and the sealing glass 13 is bonded on the substrate 12 so that the groove 15A of each sealing glass 13 corresponds to the arch-like portion of the wire bond 16 formed on each substrate 12 by wire-bonding.

Finally, as illustrated in FIG. 3G, a baking device and the like applies heat to cure the adhesive 14. As described above, four solid-state imaging devices 10 are completed. Note that, an upper diagram in FIG. 3G is a diagram of the sealing glass 13 viewed from the side of the substrate 12, and a lower diagram in FIG. 3G is a cross-sectional diagram of the solid-state imaging device 10.

In the example in FIGS. 2A, 2B, 2C, 2D, 2E, 3A, 3B, 3C, 3D, 3E, 3F, and 3G, the sealing glasses 13 of the four solid-state imaging devices 10 are simultaneously formed. However, the number of simultaneously formed sealing glasses 13 is not limited to four.

(Second Example of Manufacturing Method of Solid-State Imaging Device)

FIGS. 4A, 4B, 4C, and 4D are diagrams to describe a second example of a manufacturing method of the solid-state imaging device 10 in FIGS. 1A and 1B.

The manufacturing method in FIGS. 4A, 4B, 4C, and 4D is different from that in FIGS. 2A, 2B, 2C, 2D, 2E, 3A, 3B, 3C, 3D, 3E, 3F, and 3G in that the sealing glass 13 is not divided after the formation of the groove 15A in FIG. 3A and the sealing glass 13 is divided into pieces after the sealing glass 13 and the substrate 12 are bonded to each other.

Figure 4A:
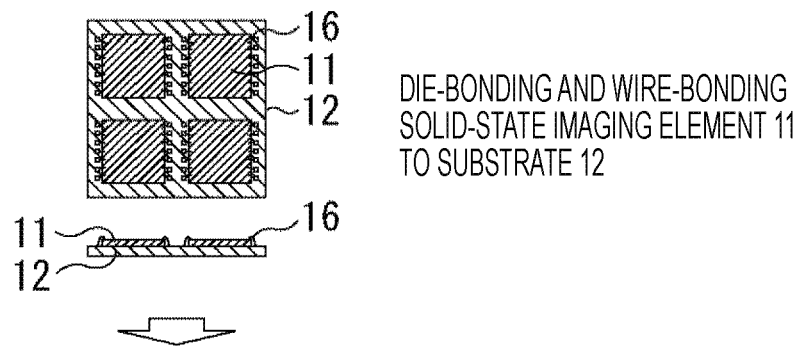
FIGS. 4A, 4B, 4C, and 4D are diagrams to describe a second example of a manufacturing method of the solid-state imaging device in FIGS. 1A and 1B.
Figure 4B:
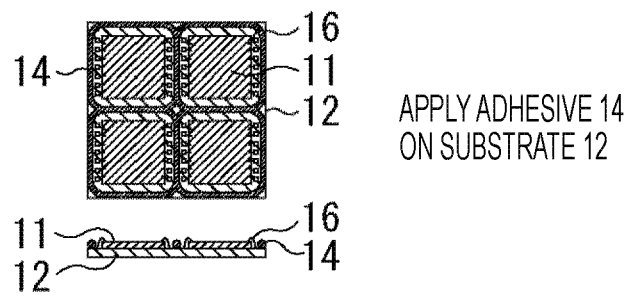

Specifically, after the processing in of FIGS. 2A, 2B, 2C, 2D, 2E, and FIG. 3A has been performed, as illustrated in FIG. 4A, four solid-state imaging elements 11 are die-bonded to the substrate 12 with high accuracy, and then, are wire-bonded. Note that an upper diagram in FIG. 4A is a diagram of the substrate 12, on which the four solid-state imaging elements 11 are die-bonded and wire-bonded, viewed from a side to be bonded to the sealing glass 13, and a lower diagram in FIG. 4B is a cross-sectional diagram. This is similarly applied to FIG. 4B.

Figure 4C:
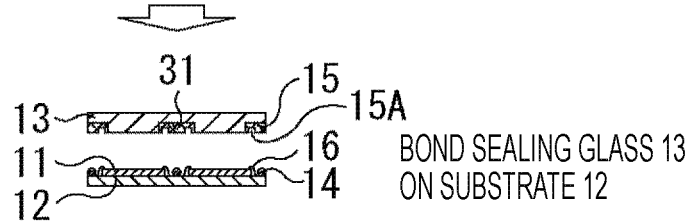

After the four solid-state imaging elements 11 have been die-bonded and wire-bonded to the substrate 2, as illustrated FIG. 4B, the black adhesive 14 is uniformly applied on the region corresponding to the outer periphery of the divided substrate 12. Then, as illustrated in FIG. 4C, the surface of the substrate 12 where the solid-state imaging element 11 is arranged faces to the surface of the sealing glass 13 where the light-shielding resin 15 is embedded, and the sealing glass 13 is bonded on the substrate 12 so that the groove 15A of the sealing glass 13 corresponds to the arch-like portion of the wire bond 16 formed on the substrate 12 by wire-bonding.

Figure 4D:
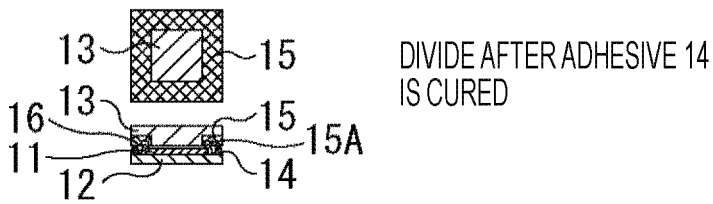

Finally, as illustrated in FIG. 4D, a baking device and the like applies heat to cure the adhesive 14. Subsequently, the dicing device cuts the centers of the light-shielding resin 15 (groove 31) along the horizontal direction and the vertical direction, and the solid-state imaging device 10 is divided. As described above, four solid-state imaging devices 10 are completed.

Since the four solid-state imaging devices 10 can be simultaneously formed by the manufacturing method in FIGS. 4A, 4B, 4C, and 4D, the manufacturing cost can be further reduced. Note that, in the example in FIGS. 4A, 4B, 4C, and 4D, the four solid-state imaging devices 10 are simultaneously formed. However, the number of simultaneously formed solid-state imaging devices 10 is not limited to four.

As described above, in the sealing glass 13 of the solid-state imaging device 10, the light-shielding resin 15 is embedded in the region corresponding to the outer periphery which is the region other than the light receiving portion of the solid-state imaging element 11. Therefore, occurrence of a flare or a ghost caused by reflection of light in the outer periphery of the solid-state imaging element 11 (region where pads, peripheral circuits, plating, wire bond 16, and the like are formed) can be prevented.

Furthermore, the light-shielding resin 15 can be formed only by forming the groove 31, applying, curing, and polishing the light-shielding resin 32 by the dicing device, the polishing device, and the like which are used at the time of normal glass processing. Therefore, the occurrence of a flare or a ghost caused by reflection of light in the outer periphery of the solid-state imaging element 11 can be prevented at low cost. Furthermore, by changing settings of the dicing device, it is possible to easily change the shape and the size of the light-shielding resin 15.

In addition, since the groove 15A is formed in the region of the light-shielding resin 15 corresponding to the arch-like portion of the wire bond 16, the sealing glass 13 can be closer to the solid-state imaging element 11 than a case where the groove 15A is not formed. Therefore, it is possible to reduce the height of the solid-state imaging device 10. In addition, since it is not necessary to provide a member for preventing a contact between the solid-state imaging element 11 and the sealing glass 13, the manufacturing cost can be reduced.

On the other hand, in a case where a light shielding plate or a dark-color molded member is formed in the region corresponding to the region other than the light receiving portion, processing using a mold is required, and the manufacturing cost increases. Furthermore, in a case where the shape or the size of the light-shielded region is changed, it is necessary to form a new mold. Therefore, the manufacturing cost increases as the shape or the size of the light-shielded region is changed. In addition, the arrangement of the light shielding plate and the molded member prevents reduction in the height.

In addition, in a case where a dark-color film is formed on the region of the sealing glass 13 corresponding to the region other than the light receiving portion, processing using a print mask is required, and the manufacturing cost increases similarly to the processing using the mold.

Furthermore, in a case where dark-color liquid resin is applied to the region other than the light receiving portion, to prevent entrance of the liquid resin to the light receiving portion, it is necessary to form ribs around the light receiving portion or form a transparent resin or the like on the upper portion of the light receiving portion. In a case where the ribs are formed around the light receiving portion, the manufacturing cost increases, and the rib makes it difficult to sufficiently reduce the height. In addition, in a case where a transparent resin or the like is formed on the upper portion of the light receiving portion, since a refractive index of the transparent resin is different from that of air, a light receiving sensitivity deteriorates. In addition, depending on unevenness and application environment of the light receiving portion, unevenness or contamination of the transparent resin easily occurs.

Second Embodiment (Exemplary Configuration of Second Embodiment of Solid-State Imaging Device)

Figure 5A:
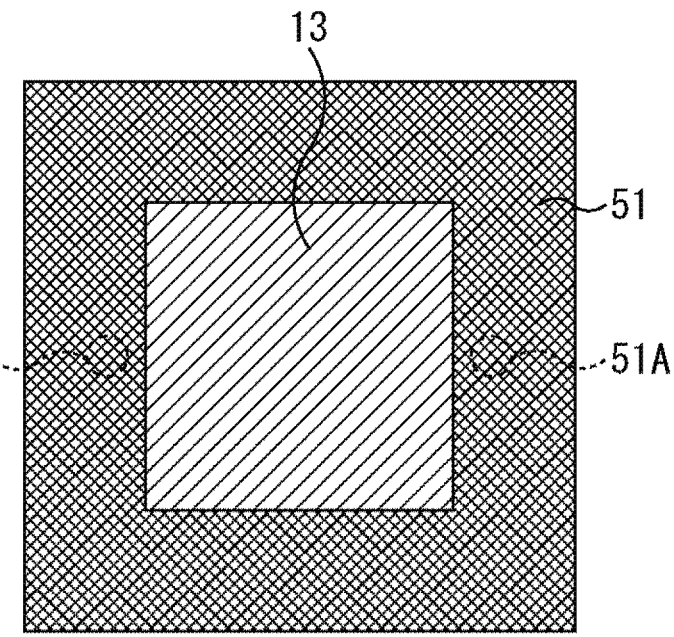
FIGS. 5A and 5B are diagrams of an exemplary configuration of a second embodiment of a solid-state imaging device to which the present disclosure is applied.
Figure 5B:
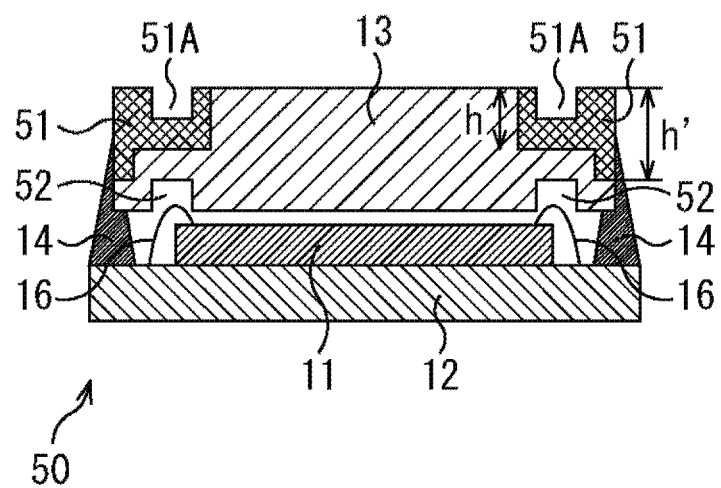

FIGS. 5A and 5B are diagrams of an exemplary configuration of a second embodiment of a solid-state imaging device to which the present disclosure is applied.

The components illustrated in FIGS. 5A and 5B which are the same as those in FIGS. 1A and 1B are denoted with the same reference numerals. The overlapped description will be appropriately omitted.

A configuration of a solid-state imaging device 50 in FIGS. 5A and 5B is different from that of the solid-state imaging device 10 in FIGS. 1A and 1B in that a black light-shielding resin 51 is formed instead of the light-shielding resin 15 and grooves 52 are formed in the sealing glass 13. FIG. 5A is a diagram of the sealing glass 13 viewed from a side opposite to a substrate 12, and FIG. 5B is a cross-sectional diagram of the solid-state imaging device 50.

As illustrated in FIGS. 5A and 5B, in the solid-state imaging device 50, the light-shielding resin 51 is embedded in a surface of the sealing glass 13 opposite to a surface facing to a solid-state imaging element 11. A thickness h' of the light-shielding resin 51 at an end of the sealing glass 13 is thicker than a thickness h of the light-shielding resin 51 on the inner side. With this structure, it is possible to prevent light from entering the sealing glass 13 from a side surface. Furthermore, in the light-shielding resin 51, boss holes 51A are formed which are used to determine arrangement of the sealing glass 13 when the sealing glass 13 is arranged on the substrate 12.

In the sealing glass 13, the groove 52 is formed in a region corresponding to an arch-like portion of a wire bond 16. With this structure, the arch-like portion of the wire bond 16 can enter the groove 52. As a result, it is not necessary to provide a molded member to prevent a contact between the wire bond 16 and the sealing glass 13 in the solid-state imaging device 50, and manufacturing cost can be reduced. In addition, it is possible to reduce the height of the solid-state imaging device 50.

(Example of Manufacturing Method of Solid-State Imaging Device)

FIGS. 6A, 6B, 6C, 6D, 6E, 6F, 7A, 7B, 7C, 7D, 7E, 7F, and 7G are diagrams to describe an example of a manufacturing method of the solid-state imaging device 50 in FIGS. 5A and 5B.

In the example in FIGS. 6A, 6B, 6C, 6D, 6E, 6F, 7A, 7B, 7C, 7D, 7E, 7F, and 7G, a package size of the solid-state imaging device 50 is 10 mm square, and 2×2 solid-state imaging devices 50 are formed.

First, as illustrated in FIG. 6A, the sealing glass 13 having a size of 22 mm square and a thickness of one mm is formed by using optical glass. Furthermore, an upper diagram in FIG. 6A is a diagram of the sealing glass 13 viewed from a side opposite to a side to be bonded to the substrate 12, and a lower diagram in FIG. 6A is a cross-sectional diagram of the sealing glass 13. This is similarly applied to FIG. 6B, FIG. 6C, and FIG. 6F, which will be described later.

After the sealing glass 13 has been formed, as illustrated in FIG. 6B, a dicing device forms a groove 71 having a depth of 0.5 mm at a 10 mm interval and in a region having a width of two mm as a region corresponding to the outer periphery of the solid-state imaging element 11 on the sealing glass 13, and a region with a width of one mm on the center of the groove 71 is more dug without penetrating the sealing glass 13.

Then, as illustrated in FIG. 6C, a light-shielding resin 72 is uniformly applied on the entire surface of the sealing glass 13 where the groove 71 is formed so as to be completely fitted into the groove 71. It is desirable that a resin viscosity of the light-shielding resin 72 at the time of application be maintained to be equal to or less than 30 Pa·s so that bubbles do not enter the resin.

After the light-shielding resin 72 has been applied, as illustrated in FIG. 6D, the light-shielding resin 72 is cured by heat or ultraviolet light. By using a light-shielding resin having a linear expansion coefficient of equal to or less than 30 ppm/° C. and a molding shrinkage rate of equal to or less than 0.5% as the light-shielding resin 72, warpage of the cured sealing glass 13 can be reduced as possible.

After the light-shielding resin 72 has been cured, as illustrated in FIG. 6E, boss holes 73 are formed in the regions of the surface of the light-shielding resin 72 in which the boss holes 51A are formed without exposing the sealing glass 13. Then, as illustrated in FIG. 6F, a plane polishing device for processing glass polishes the surface of the light-shielding resin 72 until the sealing glass 13 is exposed to be the outermost surface, and the light-shielding resin 51 having the boss holes 51A is formed.

Next, as illustrated in FIG. 7A, a dicing device forms the groove 52 in a region corresponding to the arch-like portion of the wire bond 16 on the surface of the sealing glass 13 opposite to the polished surface without exposing the sealing glass 13. Furthermore, an upper diagram in FIG. 7A is a diagram of the sealing glass 13 viewed from a side to be bonded to the substrate 12, and a lower diagram in FIG. 7A is a cross-sectional diagram of the sealing glass 13. This is similarly applied to FIG. 7B to be described later.

After the groove 52 has been formed, as illustrated in FIG. 7B, the dicing device cuts the centers of the light-shielding resin 51 (groove 71) along the horizontal direction and the vertical direction. With this processing, as illustrated in FIG. 7C, the sealing glass 13 in which the light-shielding resin 51 is embedded is divided into pieces of 10 mm square.

Note that, an upper diagram in FIG. 7C is a diagram of the sealing glass 13, in which the light-shielding resin 51 is embedded, viewed from a side opposite to a side to be bonded to the substrate 12, and a center diagram in FIG. 7C is a cross-sectional diagram of the sealing glass 13 in which the light-shielding resin 51 is embedded. Furthermore, a lower diagram in FIG. 7C is a diagram of the sealing glass 13, in which the light-shielding resin 51 is embedded, viewed from the side to be bonded to the substrate 12.

After the sealing glass 13 has been divided, processing is performed for each solid-state imaging device 50. Specifically, as illustrated in FIG. 7D, the solid-state imaging element 11 is die-bonded to the substrate 12 with high accuracy, and then, is wire-bonded.

Note that an upper diagram in FIG. 7D is a diagram of the substrate 12 on which the solid-state imaging element 11 is die-bonded and wire-bonded viewed from a side to be bonded to the sealing glass 13, and a lower diagram in FIG. 7D is a cross-sectional diagram of the substrate 12 on which the solid-state imaging element 11 is die-bonded and wire-bonded. This is similarly applied to FIG. 7E.

After the solid-state imaging element 11 has been die-bonded and wire-bonded to the substrate 2, as illustrated in FIG. 7E, the black adhesive 14 is uniformly applied on the outer periphery of the substrate 12. Then, as illustrated in FIG. 7F, while a surface of the substrate 12 where the solid-state imaging element 11 is arranged is caused to face to a surface of the sealing glass 13 where the groove 52 is formed, and the sealing glass 13 is bonded on the substrate 12 so that the boss holes 51A of the sealing glass 13 and pins (not shown) formed in a lens of the light receiving portion of the solid-state imaging element 11 are positioned with a predetermined positional relation.

With this positioning, the groove 52 of the sealing glass 13 corresponds to the arch-like portion of the wire bond 16 formed on the substrate 12 by wire-bonding. As described above, by using the boss holes 51A, a bonding position of the sealing glass 13 relative to the substrate 12 can be easily determined.

Finally, as illustrated in FIG. 7G, a baking device and the like applies heat to cure the adhesive 14. As described above, four solid-state imaging devices 50 are completed. Note that, an upper diagram in FIG. 7G is a diagram of the sealing glass 13 viewed from a side opposite to the substrate 12, and a lower diagram in FIG. 7G is a cross-sectional diagram of the solid-state imaging device 50.

In the example in FIGS. 6A, 6B, 6C, 6D, 6E, 6F, 7A, 7B, 7C, 7D, 7E, 7F, and 7G, the sealing glasses 13 of the four solid-state imaging devices 50 are simultaneously formed. However, the number of simultaneously formed sealing glasses 13 is not limited to four.

Furthermore, as in a case of FIGS. 4A, 4B, 4C, and 4D, a plurality of solid-state imaging devices 50 may be simultaneously formed by dividing the sealing glass 13 after bonding the sealing glass 13 to the substrate 12 without dividing the sealing glass 13 after forming the groove 52 in FIG. 7A.

In the examples in FIGS. 2A, 2B, 2C, 2D, 2E, 3A, 3B, 3C, 3D, 3E, 3F, 3G, 4A, 4B, 4C, 4D, 6A, 6B, 6C, 6D, 6E, 6F, 7A, 7B, 7C, 7D, 7E, 7F, and 7G, since the package size of the solid-state imaging element 11 is 10 mm square, to secure a space for the wire bond and the adhesive 14, it is desirable that the chip size of the solid-state imaging element 11 be equal to or less than eight mm and the thickness of the chip be equal to or less than 0.2 mm.

In addition, in the examples in FIGS. 2A, 2B, 2C, 2D, 2E, 3A, 3B, 3C, 3D, 3E, 3F, 3G, 4A, 4B, 4C, 4D, 6A, 6B, 6C, 6D, 6E, 6F, 7A, 7B, 7C, 7D, 7E, 7F, and 7G, the solid-state imaging element 11 is die-bonded and wire-bonded to the substrate 12 after the sealing glass 13 has been formed. However, as long as die-bonding and wire-bonding are completed at the time of bonding the sealing glass 13 to the substrate 12, die-bonding and wire-bonding may be performed at any time. For example, die-bonding and wire-bonding may be performed before the sealing glass 13 is formed or during the sealing glass 13 is formed.

Third Embodiment (Exemplary Configuration of Embodiment of Imaging Device)

Figure 8:
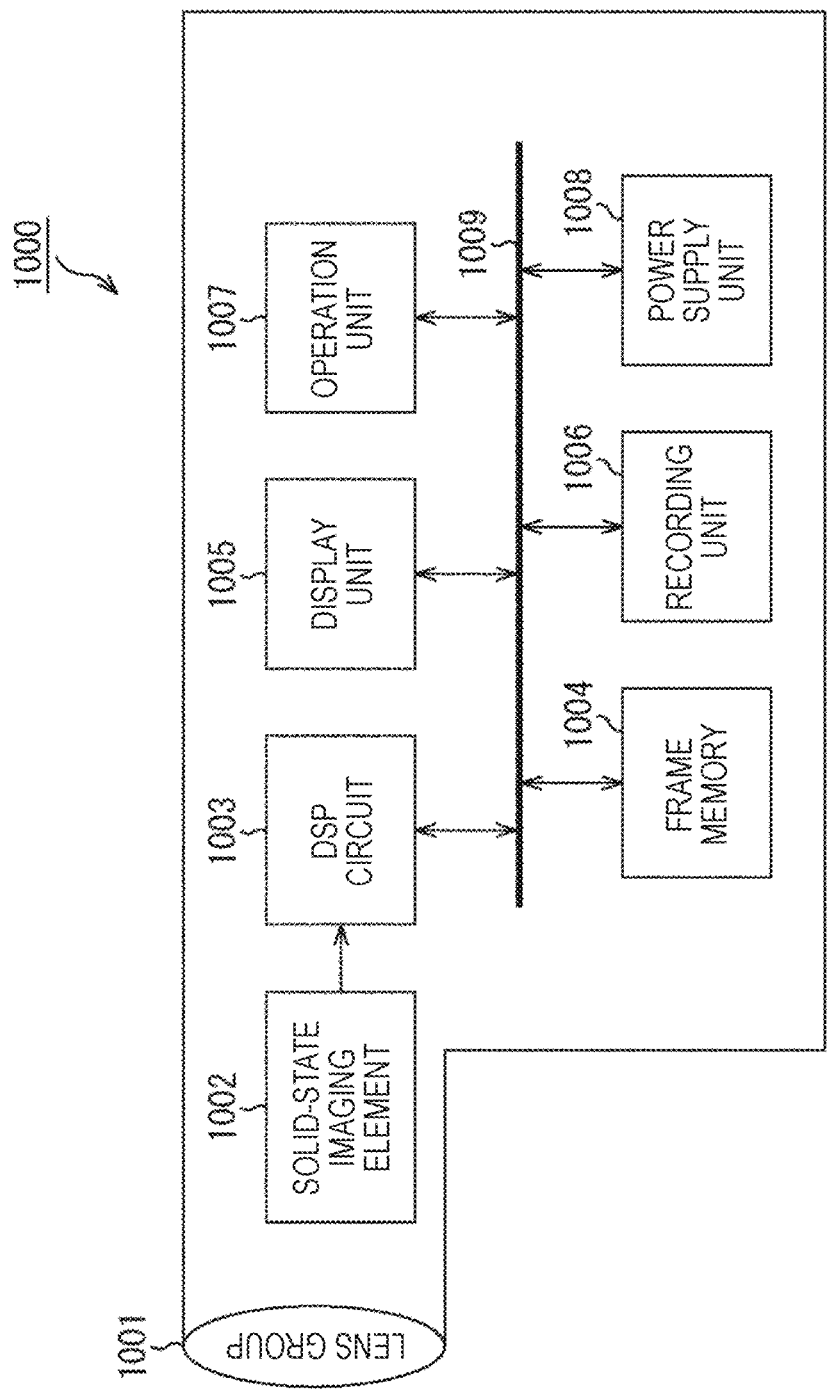
FIG. 8 is a block diagram of an exemplary configuration of an imaging device as an electronic device to which the present disclosure is applied.
Figure 9:
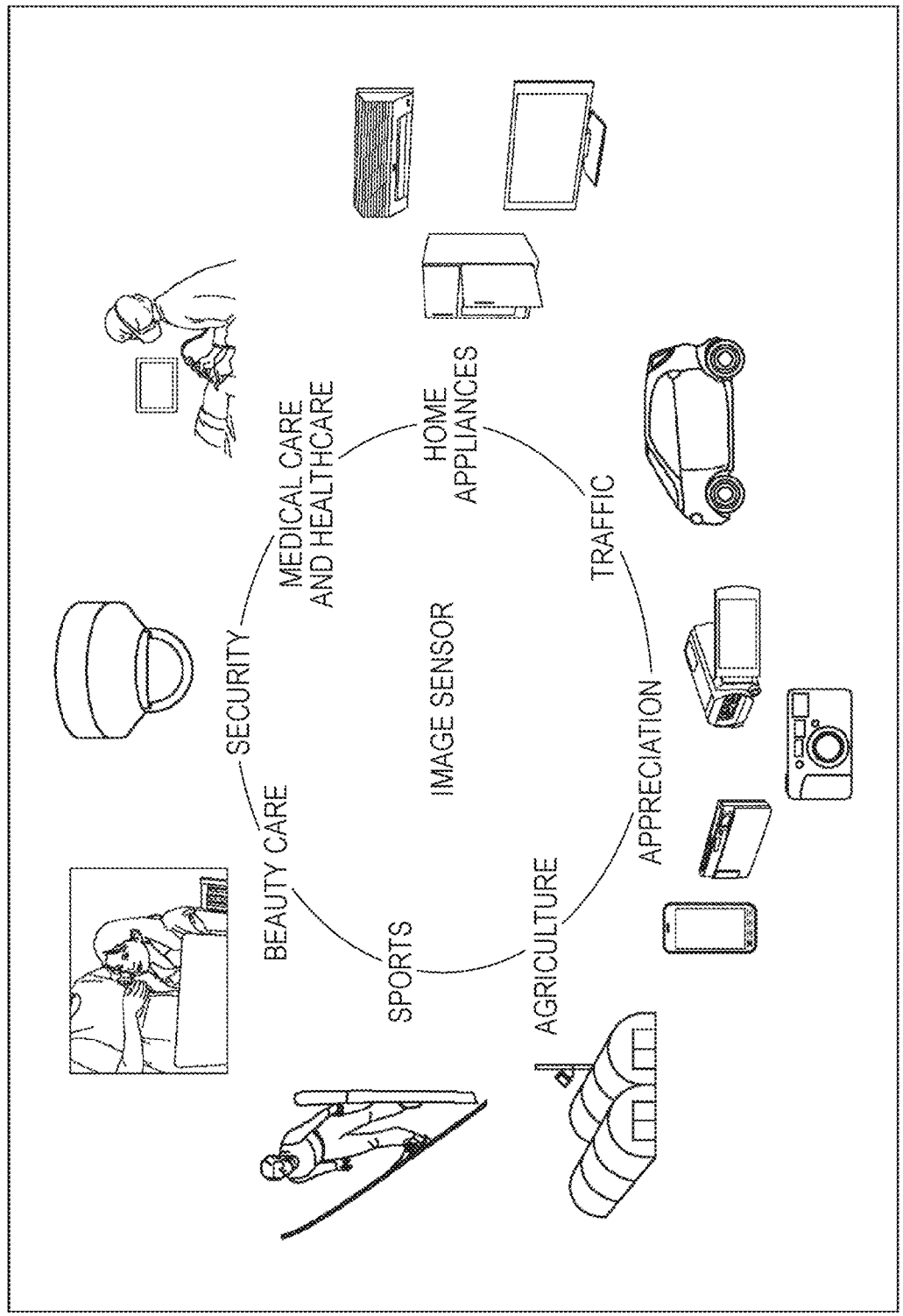
FIG. 9 is a diagram of an exemplary usage of the solid-state imaging device.

FIG. 8 is a block diagram of an exemplary configuration of an embodiment of an imaging device as an electronic device to which the present disclosure is applied.

An imaging device 1000 in FIG. 8 is a video camera, a digital still camera, or the like. The imaging device 1000 includes a lens group 1001, a solid-state imaging element 1002, a DSP circuit 1003, a frame memory 1004, a display unit 1005, a recording unit 1006, an operation unit 1007, and a power supply unit 1008. The DSP circuit 1003, the frame memory 1004, the display unit 1005, the recording unit 1006, the operation unit 1007, and the power supply unit 1008 are mutually connected via a bus line 1009.

The lens group 1001 captures incident light (image light) from a subject and forms an image on an imaging surface of the solid-state imaging element 1002. The solid-state imaging element 1002 includes the solid-state imaging device 10 or the solid-state imaging device 50. The solid-state imaging element 1002 converts a light amount of the incident light imaged on the imaging surface by the lens group 1001 into an electric signal in pixel units and supplies the signal to the DSP circuit 1003 as a pixel signal.

The DSP circuit 1003 performs predetermined image processing on the pixel signal supplied from the solid-state imaging element 1002, supplies the image-processed image signal to the frame memory 1004 in frame units, and makes the frame memory 1004 temporarily store the image signal.

The display unit 1005 includes a panel type display device such as a liquid crystal panel or an organic Electro Luminescence (EL) panel, for example, and displays an image on the basis of the pixel signal in frame units which has been temporarily stored in the frame memory 1004.

The recording unit 1006 includes a Digital Versatile Disk (DVD), a flash memory, or the like and reads and records the pixel signal in frame units which has been temporarily stored in the frame memory 1004.

The operation unit 1007 issues an instruction for operating various functions of the imaging device 1000 under a user's operation. The power supply unit 1008 appropriately supplies power to the DSP circuit 1003, the frame memory 1004, the display unit 1005, the recording unit 1006, and the operation unit 1007.

An electronic device to which the present technology is applied may be a device using the solid-state imaging device 10 or the solid-state imaging device 50 as an image capturing unit (photoelectric conversion unit), the electronic device may be a portable terminal device having an imaging function and a copying machine using the solid-state imaging device 10, the solid-state imaging device 50 as an image reading unit, or the like, in addition to the imaging device 1000.

<Exemplary Usage of Solid-State Imaging Device>

FIG. 9 is a diagram of an exemplary usage in which the solid-state imaging device 10 or the solid-state imaging device 50 is used.

The solid-state imaging device 10 or the solid-state imaging device 50 described above can be used, for example, in various cases in which light such as visible light, infrared light, ultraviolet light, and X-rays are sensed as follows.

- A device which images an image to be used for appreciation, such as a digital camera and a portable device with a camera function
- A device which is used for traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like
- A device which is used for home appliances, such as a TV, a refrigerator, an air conditioner to image a gesture of a user and operates the device according to the gesture
- A device which used for medical care and healthcare, such as an endoscope, a device for angiography by receiving infrared light
- A device which is used for security, such as a security monitoring camera, a camera for person authentication
- A device which is used for beauty care, such as a skin measuring instrument for photographing skin, a microscope for photographing a scalp
- A device which is used for sports, such as an action camera and a wearable camera for sports and the like A device which is used for agriculture, such as a camera for monitoring conditions of fields and crops Furthermore, the effects described herein are only exemplary and not limited to these. There may be an additional effect.

In addition, the embodiments of the present disclosure are not limited to the embodiments described above and can be variously changed without departing from the scope of the present disclosure.

The present disclosure can have a configuration below.

(1) A solid-state imaging device including:
a solid-state imaging element; and
a glass plate arranged on the solid-state imaging element and in which a light-shielding resin is embedded in a region corresponding to a region other than a light receiving portion of the solid-state imaging element.

(2) The solid-state imaging device according to (1), in which
the light-shielding resin is embedded in a surface of the glass plate facing to the solid-state imaging element.

(3) The solid-state imaging device according to (2), in which
a groove is formed in a region of the light-shielding resin corresponding to a wire bond for connecting the solid-state imaging element to a substrate.

(4) The solid-state imaging device according to (1), in which
the light-shielding resin is embedded in a surface opposite to a surface of the glass plate facing to the solid-state imaging element.

(5) The solid-state imaging device according to (4), in which
a groove is formed in a region of the glass plate corresponding to a wire bond for connecting the solid-state imaging element to a substrate.

(6) The solid-state imaging device according to (4) or (5), in which
in the light-shielding resin, holes are formed which are used to determine arrangement of the glass plate when the glass plate is arranged on the substrate to which the solid-state imaging element is connected.

(7) The solid-state imaging device according to any one of (4) to (6), in which
a thickness of the light-shielding resin at an end of the glass plate is thicker than the light-shielding resin on an inner side.

(8) A manufacturing method of a solid-state imaging device including:
forming a groove in a region of a glass plate corresponding to a region other than a light receiving portion of a solid-state imaging element;
embedding a light-shielding resin into the groove and curing the light-shielding resin; and
arranging the glass plate on the solid-state imaging element.

(9) An electronic device including:
a solid-state imaging element; and
a glass plate arranged on the solid-state imaging element and in which a light-shielding resin is embedded in a region corresponding to a region other than a light receiving portion of the solid-state imaging element.

REFERENCE SIGNS LIST 10 solid-state imaging device
11 solid-state imaging element
12 substrate
13 sealing glass
15 light-shielding resin
15A groove
16 wire bond
31 groove
32 light-shielding resin
50 solid-state imaging device
51 light-shielding resin
51A boss hole
52 groove
1000 imaging device

The invention claimed is:

1. A solid-state imaging device, comprising:
a substrate;
a solid-state imaging element on the substrate;
a wire bond on the substrate, wherein
the wire bond includes an arch-like portion, and
the wire bond connects the solid-state imaging element to the substrate;
a glass plate on the solid-state imaging element, wherein
the glass plate comprises a first surface that faces the solid-state imaging element; and
a light-shielding resin embedded in a first region of the first surface, wherein
the first region is different from a second region of the glass plate,
the second region corresponds to a light receiving portion of the solid-state imaging element,
the light-shielding resin comprises a groove,
the groove faces the wire bond,
the wire bond is spaced apart from the light-shielding resin, and
the arch-like portion of the wire bond is in the groove in a non-contact manner.

2. The solid-state imaging device according to claim 1, wherein the light-shielding resin is spaced apart from the solid-state imaging element and the substrate.

3. An electronic device, comprising:
a substrate;
a solid-state imaging element on the substrate;
a wire bond on the substrate, wherein
the wire bond includes an arch-like portion, and
the wire bond connects the solid-state imaging element to the substrate;
a glass plate on the solid-state imaging element, wherein
the glass plate comprises a surface that faces the solid-state imaging element; and
a light-shielding resin embedded in a first region of the surface, wherein
the first region is different from a second region of the glass plate,
the second region corresponds to a light receiving portion of the solid-state imaging element,
the light-shielding resin comprises a groove,
the groove faces the wire bond,
the wire bond is spaced apart from the light-shielding resin, and
the arch-like portion of the wire bond is in the groove in a non-contact manner.

* * * * *